United States Patent
Shirasaki et al.

(10) Patent No.: US 6,692,847 B2
(45) Date of Patent: Feb. 17, 2004

(54) MAGNETO RESISTIVE SENSOR

(75) Inventors: Fumio Shirasaki, Ooyadai-machi (JP);
Hiroyuki Mima, Hitachinaka (JP);
Hitoshi Harata, Utsunomiya (JP);
Hiromitsu Itabashi, Kumagaya (JP)

(73) Assignee: Hitachi Metals, Ltd., Tokyo (JP)

( * ) Notice: Subject to any disclaimer, the term of this patent is extended or adjusted under 35 U.S.C. 154(b) by 65 days.

(21) Appl. No.: 10/020,946

(22) Filed: Dec. 19, 2001

(65) Prior Publication Data

US 2002/0090534 A1 Jul. 11, 2002

(30) Foreign Application Priority Data

Feb. 1, 1920 (JP) ........................................ 2001-025977
Jan. 9, 2001 (JP) ........................................ 2001-000965

(51) Int. Cl.[7] ............................................. B32B 19/00
(52) U.S. Cl. ...................... 428/692; 360/313; 360/324; 428/65.3; 428/694 MM
(58) Field of Search ................ 428/692, 65.3, 428/694 MM; 360/313, 324

(56) References Cited

U.S. PATENT DOCUMENTS 5,057,380 A    10/1991   Hayashi et al.
5,750,230 A  * 5/1998    Ishikawa et al. ............ 428/65.3
5,989,406 A  * 11/1999   Beetz et al. ................. 205/118

FOREIGN PATENT DOCUMENTS

| JP | 09-12051 | * 5/1997 | ............ G11B/5/66 |
| JP | 2812042 | 8/1998 | |
| JP | 2000-275059 | * 10/2000 | .......... G01D/5/245 |

* cited by examiner

*Primary Examiner*—Deborah Jones
*Assistant Examiner*—Vivek Koppikar

(57) ABSTRACT

A magneto resistive sensor having a GMR magnetic laminated film is disclosed. The GMR magnetic laminated film comprises a plurality of magnetic thin layers having a NiCoFeB composition alternately laminated with a nonmagnetic thin layer, such as copper layer. Since the magnetic thin layer contains B in its composition, the GMR magnetic laminated film can stand in magneto resistance ratio ($\Delta R/R$ %) under a high temperature of up to 250 degrees centigrade. By the reason, electric wiring can be connected by a lead-free solder to assemble a magnetic resistive sensor for a magnetic rotary encoder. The thermal resistance variation and the magneto resistance ratio are further improved when a NiFeCr underlayer is used under the GMR magnetic laminated film.

22 Claims, 9 Drawing Sheets

MAGNETO RESISTIVE SENSOR

BACKGROUND OF THE INVENTION

1. Field of the Invention

The present invention relates to a magnetic sensor having a GMR magnetic laminated film, more particularly, a magnetic sensor with an improved thermal stability.

2. Description of the Related Art

In a magneto resistive element (hereinafter referred to as an MR element) used in a magnetic sensor in a magnetic encoder, a NiFe alloy film or NiCo alloy film utilizing an anisotropic magneto resistive effect is used. Such materials have a magnet resistance ratio due to the anisotropic magneto resistive effect on the order of 2.5%. An output (signal voltage) of the magnetic encoder using the MR element ranges from 40 to 50 mV. Increasing a magnetic gap of the magnetic encoder used in a machine tool reduces the output. In order to obtain a sufficient output of the magnetic sensor even if the increased magnetic gap, the magneto resistance ratio ($\Delta R/R$) is required to become larger.

Recently, there has been contemplated that a magnetic laminated film of [Ni—Fe—Co/Cu] or [Ni—Fe/Cu], each of which is a giant magneto resistive element (GMR element) having a large magneto resistance ratio, is used as the magnetic sensor. For example, the Japanese Patent No. 2812042 discloses a magnetic sensor of a metal superlattice film having a NiCoFe layer and a nonmagnetic metal thin layer laminated with each other. According to the disclosure, in this magnetic sensor, directions of a current and an applied magnetic field are parallel with each other, and thus the magneto resistance ratio can be increased to 15 to 20%. Such a GMR element typically has the magneto resistance ratio two to four times larger than that of the MR element made of a Ni—Fe alloy or Ni—Co alloy film using the anisotropic magneto resistive effect. Since the output signal of the magnetic sensor can be increased when the magneto resistance ratio is increased, using the GMR element enables the output two or more times higher than that of the MR element (80 to 100 mV, or higher) to be obtained. With the higher output, mounting can be accomplished with a widened magnetic gap when the magnetic encoder is assembled. With the widened magnetic gap, ease of assembly is enhanced, and therefore the production yield is enhanced. Besides, through the application of the GMR element with the higher output, a fill bridge circuit that currently involves the MR element can be replaced with a half bridge circuit that involves the GMR element, thereby miniaturizing the magnetic sensor.

However, in a manufacturing process of the magnetic sensor for the magnetic encoder, the magnetic sensor may be heated in the step of soldering wires, the step of forming a protective film, or the like after the magnetic laminated film (GMR element) is fabricated. In the soldering step, for example, heat used for applying solder to a terminal section of the magnetic sensor or soldering a flexible wiring board to the terminal section may be conducted into the magnetic sensor. Thus, the magnetic laminated film having already been fabricated may be heated.

The conventional magnetic laminated film (GMR element) of [Ni—Fe—Co/Cu] or [Ni—Fe/Cu] has an insufficient thermal resistance compared to the MR element, and if the magnetic sensor is heated in the steps after the magnetic laminated film is formed, the magneto resistance ratio of the magnetic laminated film is decreased. It is considered that lead-free solder (having a composition free of Pb) will be used as the solder applied to a terminal of the magnetic sensor in the future. Compared to an eutectic point of lead solder that is 183 degrees centigrade in the case of Sn—Pb solder, the eutectic point of the lead-free solder is higher, specifically, 221 degrees centigrade in the case of Sn—Ag eutectic solder. As for the conventional magnetic laminated film of [Ni—Fe—Co/Cu] or [Ni—Fe/Cu], $\Delta R/R$ is decreased by about 10% when it is heated at the temperature of 230 degrees centigrade, so that the lead-free solder is difficult to use.

The GMR magnetic laminated film is used in the magnetic encoder. The magnetic encoder is used for a machine tool, precision machine, and optical instrument. Particularly in the precision machine and optical instrument, miniaturization of the magnetic sensor is required. For the miniaturization, a glass substrate is reduced in thickness compared to conventional one. In addition, an aluminum oxide (alumina) film or silicon oxide film is formed on a part of the protective film by sputtering. When the glass substrate is used and the protective film is formed by sputtering, the temperature of the substrate is raised to 180 to 190 degrees centigrade. If the glass substrate is reduced in thickness for the sake of miniaturization, it is difficult for heat to escape from the substrate to the sputtering apparatus, so that the temperature of the substrate is considered to be raised to 200 degrees centigrade or more. In the case of the magnetic laminated film of [Ni—Fe—Co/Cu] or [Ni—Fe/Cu], if it is heated to a temperature of 200 degrees centigrade or more, the magneto resistance ratio thereof is decreased. For example, if it is heated at 250 degrees centigrade for one hour, the magneto resistance ratio ($\Delta R/R$) is decreased by as much as 20%. If such a magnetic laminated film undergoes the manufacturing process of the magnetic encoder, the magnetic encoder with a high output can be hardly provided.

SUMMARY OF THE INVENTION

Accordingly, an object of the present invention is to provide a magneto resistive sensor having a magnetic laminated film with a large magneto resistance ratio and improved thermal resistance and a magnetic encoder using the same.

The magneto resistive sensor according to the invention includes a nonmagnetic substrate, an underlayer deposited on the substrate, and a magnetic laminated film formed on the underlayer, in which the magnetic laminated film has a plurality of magnetic thin layers and a plurality of nonmagnetic thin layers alternately laminated. The magnetic thin layer is 5 to 30 angstrom thick, and the nonmagnetic thin layer is 5 to 30 angstrom thick. The magnetic thin layer has a composition represented by the formula: $[(Ni_xCo_{1-x})_yFe_{1-y}]_zB_{1-z}$, where $0.50 < x \leq 1.00$, $0.70 \leq y < 1.00$, $0.90 \leq z < 1.00$. Preferably, in the formula of composition, x follows the inequality: $0.60 < x < 1.00$.

The formula of composition of the magnetic thin layer is represented in terms of atomic contents ratio. The atomic ratio of Ni content to the sum of Ni and Co contents is denoted by x. The atomic ratio of the sum of Ni and Co contents to the sum of Ni, Co, and Fe contents is denoted by y, in other words, the atomic ratio of Fe content to the sum of Ni, Co, and Fe contents is denoted by 1−y. Similarly, the atomic ratio of the sum of Ni, Co and Fe contents to the sum of Ni, Co, Fe, B contents is denoted by z, in other words, the atomic ratio of B content to the whole contents is denoted by 1−z.

According to the invention, the magnetic thin layer contains B, as well as Ni, Co, and Fe that are ferromagnetic metallic elements. B is added in order to improve the thermal resistance, that is, thermal stability of the magneto resistive sensor of the invention, and should satisfy the relationship: $1-z>0$. If the content of B is higher than 10 atomic % (at. %), the content of the ferromagnetic metallic elements is insufficient so that the magnetization of the magnetic thin layer is reduced, and therefore, the magneto resistance ratio is decreased. Then, the content of B should be equal to or less than 10 at. %, that is, the relationship: $1-z \leq 0.1$ ($0.9 \leq z$) should be satisfied.

Among the ferromagnetic metallic elements, Fe is an element with a large ferromagnetic spin. Therefore, the magnetic thin layer has a large spontaneous magnetization by containing Fe. In an artificial lattice GMR multi-layered film, the magnetic thin layers with a nonmagnetic thin layer interposed therebetween have spins alternately oriented in opposite directions and coupled antiferromagnetically, so that the magneto resistive effect can be enhanced by increasing the spontaneous magnetization of the magnetic thin layer. Therefore, the ratio of Fe content to the sum of the other ferromagnetic metallic elements' contents should be larger than 0. If Fe is not contained, the magneto resistance ratio is reduced and the output is decreased. That is, the inequality: $1-y>0$ ($1>y$) should be satisfied. When the ratio of Fe content is higher than 0.30, the magnetostriction becomes too large in a normal direction so that the hysteresis becomes large, and the magneto resistance ratio becomes 2% or less. Thus, the inequality: $0.70 \leq y < 1.00$ should be satisfied.

Furthermore, in the case of y less than 0.7, the NiFeCo alloy has a transformation point within the category temperature range. The alloy is a face-centered cubic (fcc) lattice at a temperature higher than the transformation point and is a body-centered cubic (bcc) lattice at a temperature lower than the transformation point. The transformation point may occur at about 200 degrees centigrade, so that when the temperature is higher than 200 degrees centigrade, the magnetic anisotropy and antiferromagnetic coupling may be lost, and thus the GMR functionality may be lost.

As described above, the magnetic thin layer according to the invention essentially contains the elements of Ni and Fe. Substituting part of Ni with Co allows the magneto resistance ratio to be increased. When the Ni content becomes as low as the Co content or lower than it, a saturation magnetic field becomes large so that the sensitivity of the magnetic sensor is degraded. Therefore, the atomic ratio x of Ni content to the sum of Ni and Co contents is required to be higher than 0.50. Thus, the inequality: $0.50 < x \leq 1.00$ should be satisfied. Here, the relationship: $x=1.00$ refers to the case where Co is not contained.

Although substituting Ni with Co allows the magneto resistance ratio to be improved, the saturation magnetic field is also increased as the substituent Co content is increased. Thus, more preferred ratio of Ni content is $0.60 < x < 1.00$.

For the nonmagnetic thin layer used in the magneto resistive sensor according to the invention, Cu, Ag, Au, Pt or the like may be used. Among these, Cu is the most suitable in terms of cost.

In order to obtain a high magneto resistance ratio, it is preferable that the magnetic thin layer is 5 to 30 angstrom thick, and the nonmagnetic thin layer is 5 to 30 angstrom thick. In particular, when the magnetic thin layer is 10 to 22 angstrom thick, and the nonmagnetic thin layer is 20 to 25 angstrom thick, a high magneto resistance ratio of 6% or higher can be obtained. If the thickness of the magnetic thin layer is 30 angstrom or more, the interlayer distance between the magnetic elements becomes relatively large, the antiferromagnetic coupling is degraded, and the magneto resistance ratio is decreased. If the thickness of the magnetic thin layer is 5 angstrom or less, the continuity of the magnetic thin film is degraded and the ferromagnetism is not exhibited. If the thickness of the nonmagnetic thin layer is 30 angstrom or more, the distance between the magnetic thin layers is widened, and the antiferromagnetic coupling is degraded. Furthermore, if the thickness of the nonmagnetic thin layer is 5 angstrom or less, the uniformity of the thickness thereof cannot be maintained and ferromagnetic coupling occurs between the magnetic thin layers, so that the magneto resistive effect cannot be obtained.

In the magnetic laminated film used in the invention, the number of the magnetic thin layers alternately laminated with the nonmagnetic thin layers is preferably 5 to 25, more preferably, 10 to 24. Since if the number of laminated layers is small, scattering probability of free electron is low so that a sufficient magneto resistance ratio cannot be obtained, the number of the laminated layers should be 5 or more. On the other hand, if the number of the laminated layers is too large, the thickness of the magnetic laminated film becomes ununiform, and the magneto resistance ratio becomes lower. Each layer may vary in thickness in the plane and have a thickness distribution to some extent. With a small number of laminated layers, even if there is such a thickness distribution, the magneto resistance ratio of the magnetic laminated film is not decreased. However, with an increased number of the laminated layers, their respective thickness distributions are added up, so that the thickness of the entire magnetic laminated film becomes ununiform, and the magneto resistance ratio is decreased. Thus, the number of the laminated layers should be 25 or less.

A glass substrate can be used as the nonmagnetic substrate. Another nonmagnetic substrate may be used. Preferably, a glass plate having alumina or the like vapor-deposited thereon is used as the nonmagnetic substrate. The magneto resistive sensor according to the invention typically has a structure having the nonmagnetic substrate, and the underlayer, such as a Ta film, deposited on the substrate by sputtering, and the magnetic laminated film provided thereon. However, the magneto resistive sensor according to the invention preferably uses the NiCr alloy or NiFeCr alloy film that is obtained by substituting part of Ni with Fe as the underlayer. Providing this alloy thin film allows the magneto resistance ratio of the magnetic laminated film to be further increased. The alloy thin film can be represented by the formula of composition: $(Ni_aFe_{1-a})_bCr_{1-b}$, where $0.4 \leq a \leq 1.0$, and $0.4 \leq b \leq 0.8$. If the Cr content in the alloy is lower than 20 at. %, the orientation of the magnetic thin layer deposited thereon is degraded. If the Cr content in the alloy is higher than 60 at. %, the effect of increasing the magneto resistance ratio is lost. Thus, the inequality: $0.6 \geq 1-b \geq 0.2$ ($0.4 \leq b \leq 0.8$) should be satisfied. While substituting part of Ni with Fe allows the magneto resistance ratio to be increased, the atomic ratio of Fe content to the sum of Ni and Fe contents should be 0.6 or less. If the ratio of Fe content is higher than 0.6, the crystal structure of the film is changed so that the film characteristics are changed. Within the range of $0.4 \leq a \leq 1.0$, the alloy thin film is the face-centered cubic lattice and is stable. However, the region of $a<0.4$ is a coexistence region of the face-centered cubic lattice and body-centered cubic lattice, where various physical quantities and magnetic characteristics of the NiFeCr alloy exhibit thermal hysteresis. The thermal hysteresis extends to the category temperature range, so that the magnetoresistance ratio of the magnetic laminated film deposited thereon is decreased when the temperature is raised. Thus, the inequality: $0 \leq 1-a \leq 0.6$ ($0.4 \leq a \leq 1.0$) should be satisfied.

The $(Ni_aFe_{1-a})_bCr_{1-b}$ underlayer is preferably 10 to 100 angstrom thick. The thickness of 10 angstrom or more allows the magneto resistance ratio to be increased. In order to further increase the magneto resistance ratio and improve the thermal resistance, the thickness is to be 50 angstrom or more. However, if the thickness of the underlayer is larger than 100 angstrom, the uniformity of the thickness of the magnetic laminated film deposited thereon is degraded and the magneto resistance ratio is decreased.

The magneto resistive sensor of the invention described above can have a large magneto resistance ratio of 12 to 18%. As for the resistance of the magnetic laminated film having a direct current applied thereto in a direction along the magnetic laminated film, assuming that the resistance value when the magnetic field is not applied thereto is denoted by R0, the resistance value when the magnetic field is applied thereto is denoted by R, and the resistance variation $\Delta R$ is represented by the formula: $\Delta R = R - R0$, then the magneto resistance ratio is denoted by $\Delta R/R0$.

In addition, the magneto resistive sensor of the invention is less susceptible to decrease in magneto resistance ratio due to a high temperature applied thereto during manufacturing process of the magnetic encoder using the sensor. The magneto resistance ratio is scarcely decreased at 200 degrees centigrade, and is decreased by about 1% at 250 degrees centigrade.

The magnetic encoder for detecting a transposition of a magnetic medium according to the invention includes a magnetic medium having magnetic patterns recorded thereon and a magneto resistive sensor facing the magnetic medium via a magnetic gap and being relatively movable to the medium. The magneto resistive sensor includes a nonmagnetic substrate, an underlayer deposited on the substrate, and a magnetic laminated film formed on the underlayer, in which the magnetic laminated film has a plurality of magnetic thin layers and a plurality of nonmagnetic thin layers alternately laminated. The magnetic thin layer is 5 to 30 angstrom thick, and the nonmagnetic thin layer is 5 to 30 angstrom thick. The magnetic thin layer has a composition represented by the formula: $[(Ni_xCo_{1-x})_yFe_{1-y}]_zB_{1-z}$, where $0.50 \leq x \leq 1.00$, $0.70 \leq y < 1.00$, $0.90 \leq z < 1.00$. Preferably, in the formula of composition, x follows the inequality: $0.60 < x < 1.00$.

Since the magneto resistance ratio of the magneto resistive sensor used in the magnetic encoder is large, a good sensitivity is provided, and thus the magnetic gap between the magnetic medium and the magneto resistive sensor may be 2 micrometers to 2 mm.

DETAILED DESCRIPTION OF THE PREFERRED EMBODIMENTS

EXAMPLE 1

Figure 1:
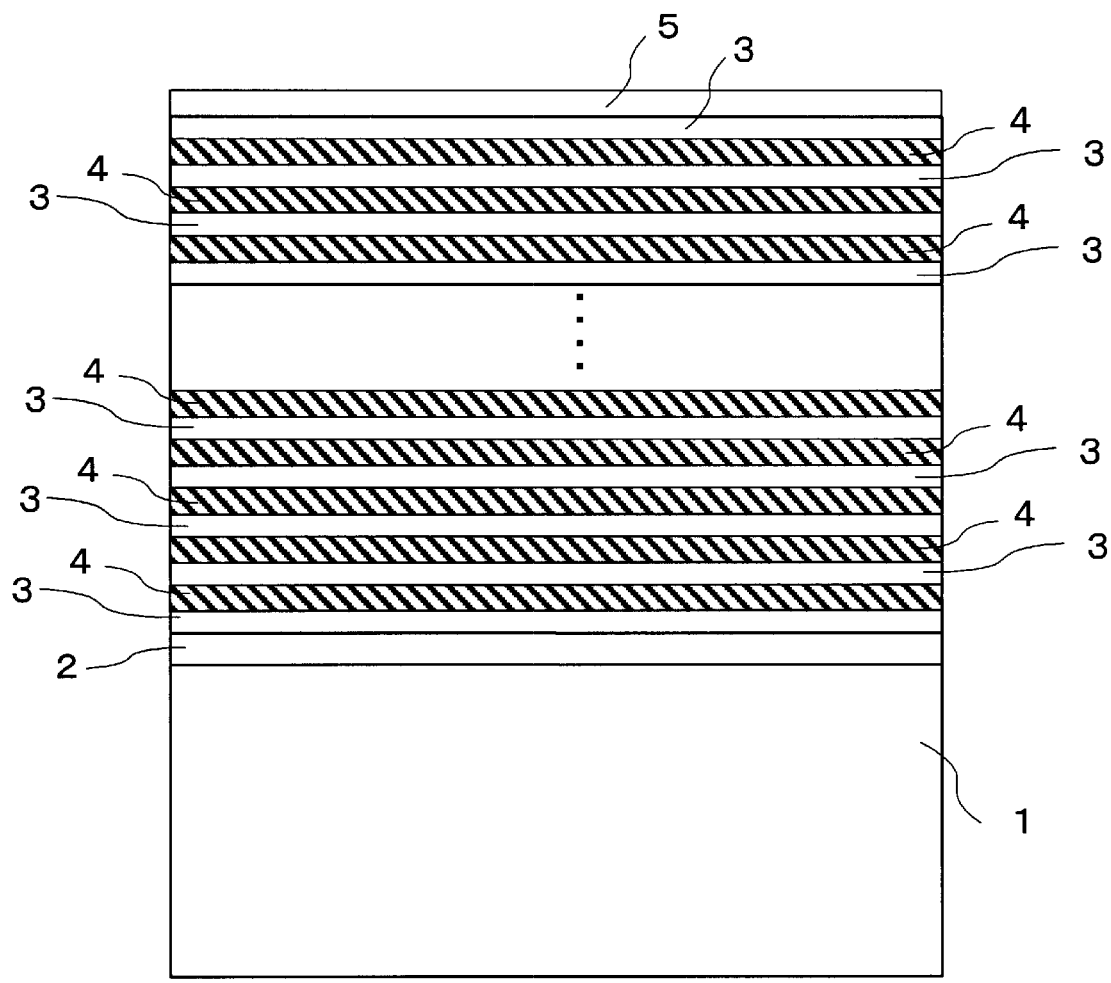
FIG. 1 shows a cross-sectional view for explanation of the magnetic laminated film according to the invention.

FIG. 1 is a cross-sectional view for explanation of a magnetic laminated film according to the invention. A Ta thin film of 30 angstrom thickness was deposited on a glass substrate 1 as an underlayer 2 by sputtering, fourteen magnetic thin layers 3 having a composition of $\{(Ni_{0.941}Co_{0.059})_{0.844}Fe_{0.156}\}_{0.995}B_{0.005}$ and fourteen nonmagnetic thin layers 4 each of which is a Cu thin film were alternately laminated on the underlayer 2 by sputtering, another magnetic thin layer 3 having the same composition was deposited thereon by sputtering, and another Ta thin film of 30 angstrom thickness was deposited at the top as a cap film 5 by sputtering, thereby providing a magnetic laminated film. While sixth to eleventh magnetic thin layers and nonmagnetic thin layers are abbreviatedly shown in FIG. 1, they constitute a laminated structure in which the magnetic thin layers 3 and nonmagnetic thin layers 4 are alternately laminated in the same manner as the laminated structure of the first to fifth magnetic thin layers and nonmagnetic thin layers. A plurality of magnetic laminated film samples were prepared in which the nonmagnetic thin layer 4 was 23 angstrom thick, and the thickness of the magnetic thin layer 3 was varied from 8 to 24 angstrom. Hereinafter, such a magnetic laminated film will be represented by [Ni—Fe—Co—B(8–24)/Cu(23)]14. The numbers in parentheses denote film thickness and the number out of square brackets denotes the number of laminated layers.

Deposition of each of the thin layers was accomplished by means of a multi-target DC magnetron sputtering apparatus while the substrate was being rotated in a vacuum, specifically under a pressure of $1.2 \times 10^{-5}$ Pa (about $9.0 \times 10^{-8}$ Torr) or lower. Here, as a target for the magnetic thin film used for fabricating the sample of [Ni—Fe—Co—B(8–24)/Cu(23)] 14, a target having composition of $Ni_{0.79}Fe_{0.16}Co_{0.05}$ (represented in terms of atomic contents ratio) with a 5×5 mm boron chip (B chip) applied thereto was used.

Figure 2:
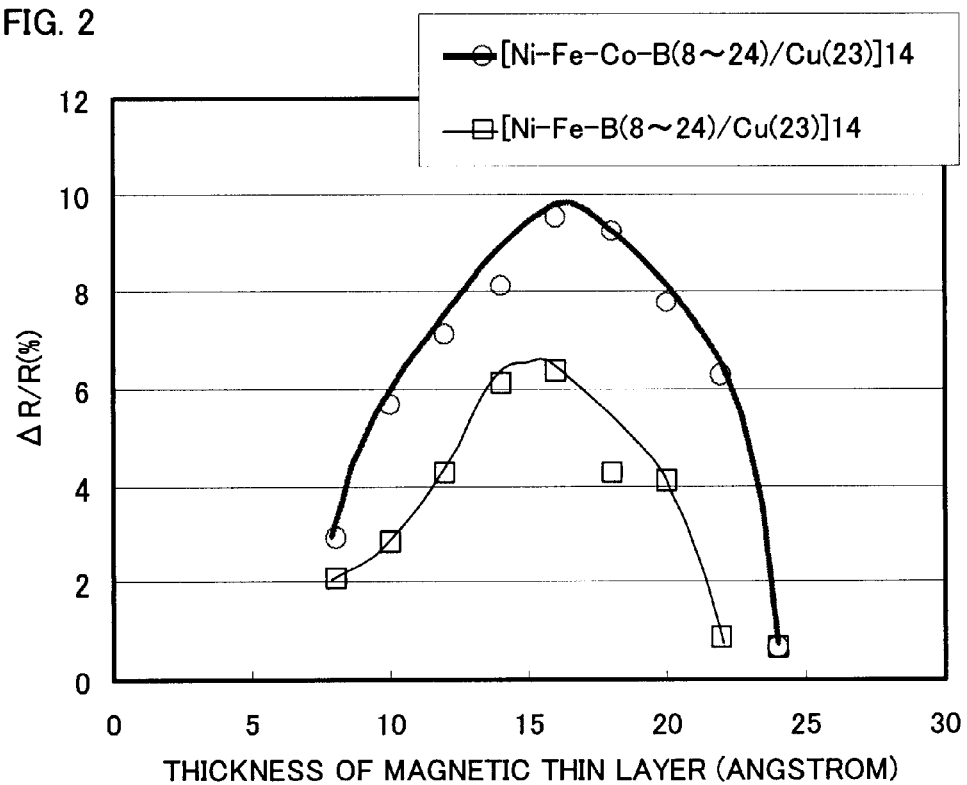
FIG. 2 is a graph showing the relationship between magneto resistance ratios ($\Delta R/R$ %) of the magnetic laminated films and thickness (angstrom) of magnetic thin layers.

The fabricated sample was subject to a heat treatment at 250 degrees centigrade for one hour in a vacuum heat treatment furnace. The magnetic field of 79 kA/m (equivalent to 1000 (Oe)) at the maximum was applied to the magnetic laminated film uniformly deposited on one surface of the substrate, and the magneto resistance ratio ($\Delta R/R$) was measured at room temperature in the four-terminal method. FIG. 2 shows plots of the relationship between the magneto resistance ratio and thickness (angstrom) of the magnetic thin layer for the magnetic laminated films fabricated by varying the thickness of the magnetic thin layer.

In this regard, the four-terminal method is intended to determine the electrical resistance by providing current terminals at two points in a surface of the magnetic laminated film for which the resistance is to be measured, placing two voltage terminals between the two current terminals in such a manner that the terminals are spaced uniformly and aligned with each other, passing a current between the two current terminals, and measuring the voltage between the voltage terminals.

EXAMPLE 2

A magnetic laminated film was formed on a glass substrate as in EXAMPLE 1 except that the composition of the magnetic thin layer was $(Ni_{0.829}Fe_{0.171})_{0.995}B_{0.005}$. The magnetic laminated film of EXAMPLE 2 is represented by [Ni—Fe—B(8–24)/Cu(23)]14. The magnetic thin layer was deposited as in EXAMPLE 1 except that a target having a composition of $Ni_{0.83}Fe_{0.17}$ (represented in terms of atomic contents ratio) with a 5-by-5 mm boron chip applied thereto was used. The heat treatment and measurement of the magneto resistance ratio were also conducted as in EXAMPLE 1.

FIG. 2 also shows a plot of the relationship between the magneto resistance ratio and thickness (angstrom) of the magnetic thin layer for this magnetic laminated film. As shown in FIG. 2, both the magnetic laminated film containing Co represented by [Ni—Fe—Co—B(8–24)/Cu(23)]14 and the magnetic laminated film not containing Co represented by [Ni—Fe—B(8–24)/Cu(23)]14 showed the maximum magneto resistance ratios ($\Delta R/R$) when the magnetic thin layer was 16 angstrom thick. The sample of [Ni—Fe—Co—B(16)/Cu(23)]14 having the magnetic thin layer of 16 angstrom thickness showed the maximum $\Delta R/R$ of 9.6%. Even if Co was not contained, the sample of [Ni—Fe—B(16)/Cu(23)]14 having the magnetic thin layer of 16 angstrom thickness showed the maximum $\Delta R/R$ of 6.5%. The magnetic laminated films in which the magnetic thin layer contained Co and was 10 to 22 angstrom thick had the magneto resistance ratio of 6% or higher. The magnetic laminated films in which the magnetic thin layer did not contain Co and was 14 to 18 angstrom thick proved to have the magneto resistance ratio of 6% or higher.

EXAMPLE 3

Figure 3:
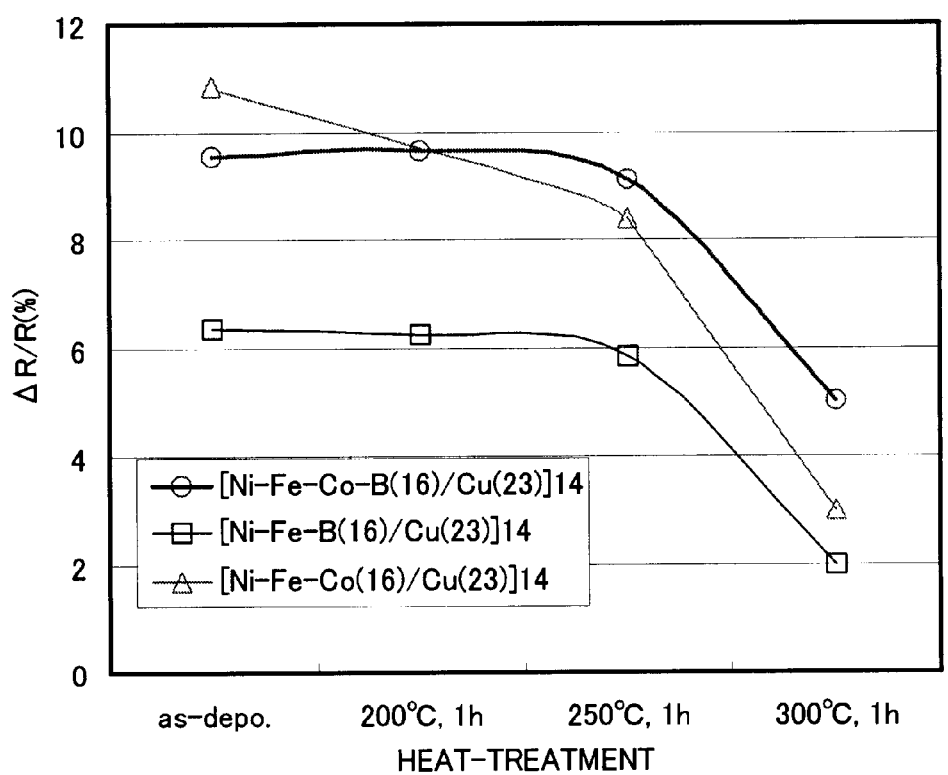
FIG. 3 is a graph showing the relationship between magneto resistance ratios ($\Delta R/R$ %) of the magnetic laminated films and heat treatment.

A plurality of magnetic laminated films having the magnetic thin layer of 16 angstrom thickness and configured as in EXAMPLES 1 and 2 were prepared. The magneto resistance ratio was measured for each of the magnetic laminated films that were not subject to heat treatment and that were subject to heat treatment, and the result is shown in FIG. 3. The heat treatment refers to a situation where the magnetic multi-layered film is exposed to disturbance heat caused by the steps conducted after the magnetic laminated film was formed. FIG. 3 shows the respective magneto resistance ratios for the sample not subject to heat treatment, the sample subject to heat treatment at 200 degrees centigrade for one hour, the sample subject to heat treatment at 250 degrees centigrade for one hour, and the sample subject to heat treatment at 300 degrees centigrade for one hour. As a result, it could be confirmed that both the samples of [Ni—Fe—Co—B(16)/Cu(23)]14 of EXAMPLE 1 and [Ni—Fe—Co—B(16)/Cu(23)]14 of EXAMPLE 2 could keep their magneto resistance ratios substantially constant for the heat treatment (disturbance) at 200 to 250 degrees centigrade and had a good thermal resistance. On the contrary, as for the comparative sample of the magnetic laminated film of [Ni—Fe—Co(16)/Cu(23)]14 including the magnetic thin layer having a composition not containing B of $(Ni_{0.941}Co_{0.059})_{0.84}Fe_{0.16}$, the magneto resistance ratio was decreased when the heat treatment temperature varied from 200 to 250 degrees centigrade, and was more sharply decreased when the temperature became higher than 250 degrees centigrade. As apparently seen from the experiment, the thermal resistance was significantly enhanced by the magnetic thin layer containing B. However, when the heat treatment was conducted at 300 degrees centigrade, the magneto resistance ratios $\Delta R/R$ for both the structures of EXAMPLES 1 and 2 were significantly decreased.

EXAMPLE 4

Figure 4:
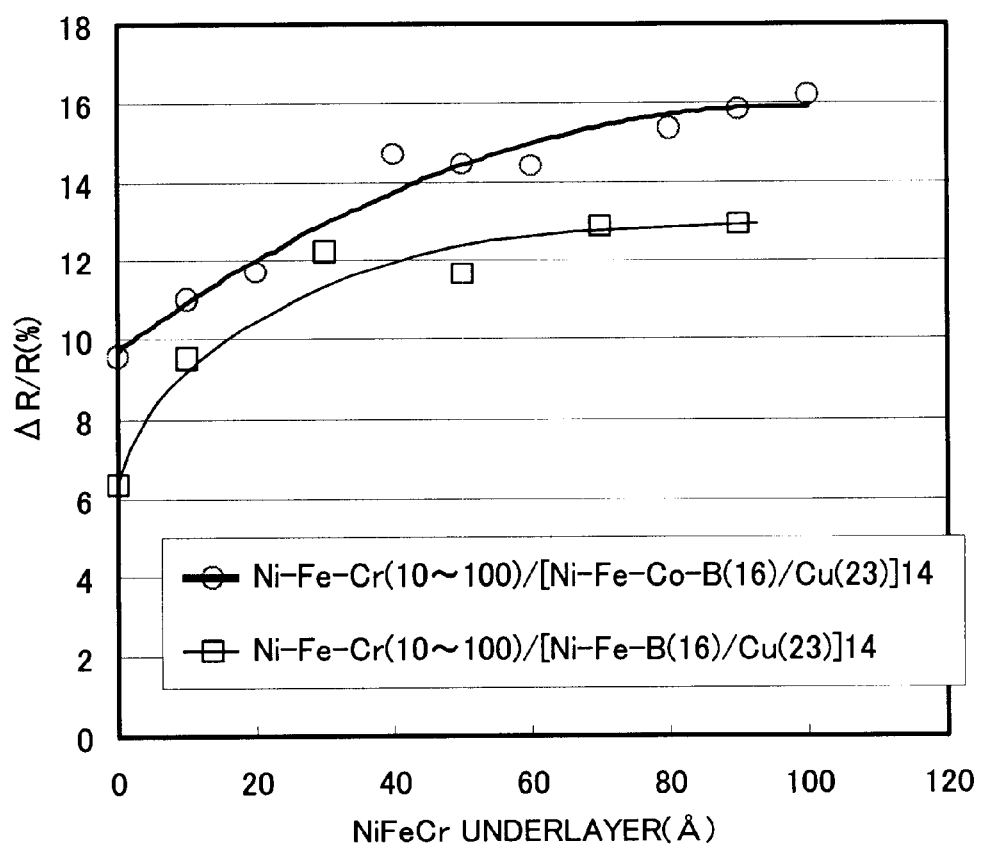
FIG. 4 is a graph showing the relationship between magneto resistance ratios ($\Delta R/R$ %) of the magnetic laminated films and NiFeCr underlayer thickness (angstrom)
Figure 5:
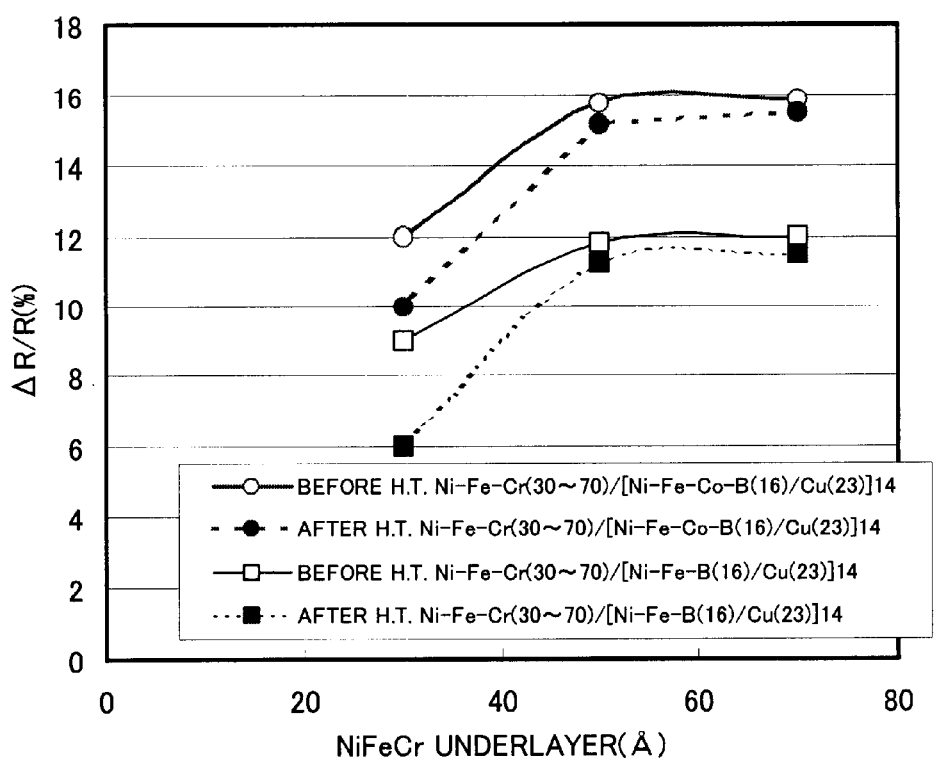
FIG. 5 is a graph showing the relationship between magneto resistance ratios ($\Delta R/R$ %) of the magnetic laminated films before and after heat treatment and NiFeCr underlayer thickness (angstrom)

Samples were fabricated in which the magnetic laminated film of [Ni—Fe—Co—B(16)/Cu(23)]14 having the magnetic thin layer of 16 angstrom thickness of EXAMPLE 1 was formed on an alloy underlayer having a composition of $(Ni_{0.82}Fe_{0.18})_{0.61}Cr_{0.39}$ instead of the Ta thin film. The plurality of samples were prepared by varying the thickness of the underlayer within the range of 10 to 100 angstrom. These samples are represented by Ni—Fe—Cr(10–100)/[Ni—Fe—Co—B(16)/Cu(23)]14. In addition, samples were fabricated in which the magnetic laminated film of [Ni—Fe—B(16)/Cu(23)]14 having the magnetic thin layer of 16 angstrom thickness of EXAMPLE 2 was formed on an alloy underlayer having a composition of $(Ni_{0.82}Fe_{0.18})_{0.61}Cr_{0.39}$ instead of the Ta thin film. The plurality of samples were prepared by varying the thickness of the underlayer within the range of 10 to 100 angstrom. These samples are represented by Ni—Fe—Cr(10–100)/[Ni—Fe—B(16)/Cu(23)]14. As in EXAMPLE 1, these samples were subject to heat treatment at 250 degrees centigrade for one hour, and then the magneto resistance ratios thereof were measured. FIG. 4 shows the measurements of the magneto resistance ratios of these samples using the thickness of the underlayer as a parameter.

When the thickness of the underlayer having the composition of $(Ni_{0.82}Fe_{0.18})_{0.61}Cr_{0.39}$ was increased, the magneto resistance ratios $\Delta R/R$ of both the samples of Ni—Fe—Cr(10–100)/[Ni—Fe—Co—B(16)/Cu(23)]14 and Ni—Fe—Cr(10–100)/[Ni—Fe—B(16)/Cu(23)]14 were increased. The sample of Ni—Fe—Cr(100)/[Ni—Fe—Co—B(16)/Cu(23)]14 having the underlayer of 100 angstrom thickness provided the maximum $\Delta R/R$ of 16%, and the sample of Ni—Fe—Cr(100)/[Ni—Fe—B(16)/Cu(23)]14 provided the maximum $\Delta R/R$ of 13%. When a magnetic sensor was fabricated using these magnetic laminated films, the resultant magnetic encoder had a large output and a sufficient thermal resistance.

EXAMPLE 5

Samples having the same structure as EXAMPLE 4 but with the underlayer being 30, 50, and 70 angstrom thick within the range of 30 to 70 angstrom were prepared. The magneto resistance ratios of both the samples of Ni—Fe—Cr(30–70)/[Ni—Fe—Co—B(16)/Cu(23)]14 and Ni—Fe—Cr(30–70)/[Ni—Fe—B(16)/Cu(23)]14 were evaluated before and after heat treatment at 250 degrees centigrade for one hour. It was found that regardless of the presence or absence of Co in the composition of the magnetic thin layer, when the thickness of the NiFeCr underlayer was 50 angstrom or more, decrease in the magneto resistance ratio due to the heat treatment at 250 degrees centigrade for one hour was suppressed, and a superior thermal resistance was provided.

EXAMPLE 6

A magnetic rotary encoder using the magneto resistive sensor according to the invention will be described below. In the perspective view of the magnetic rotary encoder of FIG. 6, there are provided a cylindrical magnetic medium 61 and a magneto resistive sensor 62 facing the magnetic medium via a predetermined magnetic gap g. On the magnetic material provided on the periphery of the cylindrical magnetic medium 61, magnetization patterns with a predetermined pitch of λ are formed successively. A rotary shaft 65 of the magnetic medium 61 is connected to a rotary shaft of a motor to be rotationally controlled, and thus the number of revolutions and rotational position of the motor are detected by the magneto resistive sensor. An output signal of the magneto resistive sensor 62 is input to a waveform shaping circuit 64 via a flexible wiring board (FPC) 63 to be subject to a signal processing such as amplification, and then is output to a controller of the motor, where it can be used for controlling the motor of the machine tool.

Figure 7:
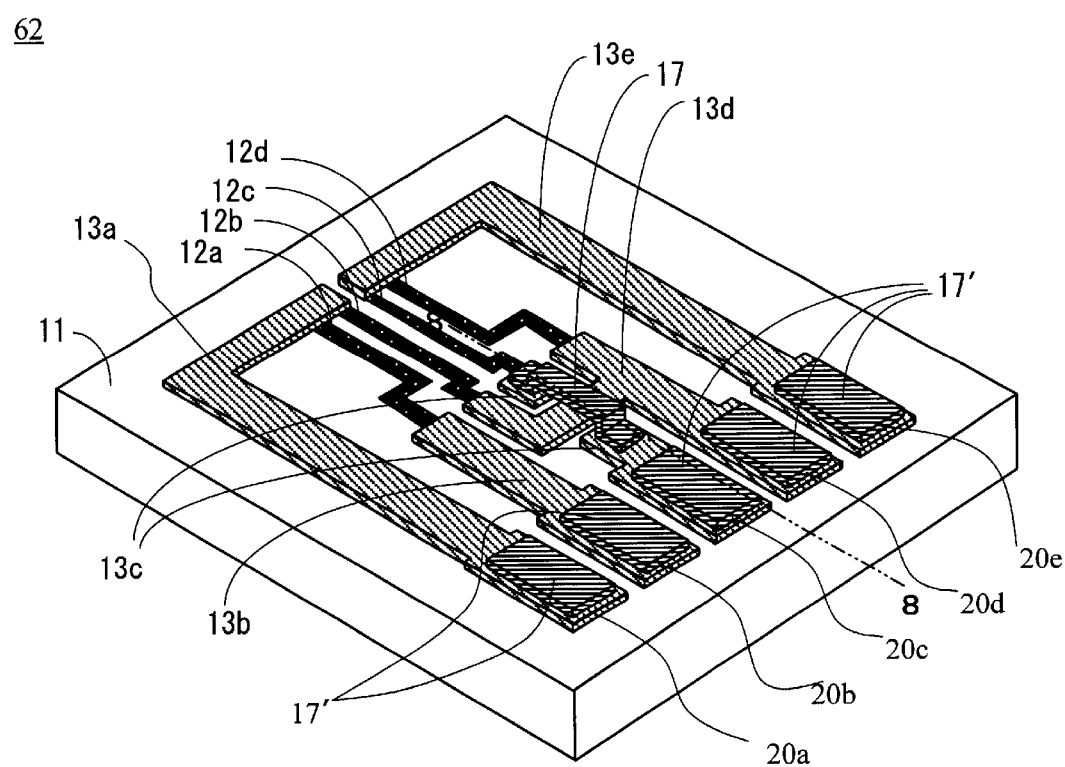
FIG. 7 is an enlarged perspective view for explanation of the a magneto resistive sensor used in the magnetic rotary encoder shown in FIG. 6.

FIG. 7 is an enlarged perspective view of the magneto resistive sensor 62. Now, the magneto resistive sensor 62 will be described. A magneto sensitive section is constituted by four magnetic laminated films 12a, 12b, 12c, and 12d provided on a nonmagnetic substrate 11 consisting of a glass plate, and wiring films 13a, 13b, 13c, 13d, and 13e are connected to both ends of the respective magnetic laminated films. The ends of the wiring films 13a to 13e are intended to provide terminals 20a, 20b, 20c, 20d, and 20e, which are formed by disposing auxiliary wiring films 17' on the end of the wiring films 13a to 13e. The terminals 20a and 20e are connected to the magnetic laminated films 12a, 12b, and 12c, 12d via the wiring films 13a and 13e, respectively. The terminal 20b is connected to the magnetic laminated film 12a via the wiring film 13b, and the terminal 20d is connected to the magnetic laminated films 12b and 12d via the wiring film 13d. The terminal 20c is connected to the magnetic laminated film 12c via the wiring film 13c, which has an auxiliary wiring film 17 for bypassing a point where it would otherwise intersect with the wiring film 13d.

The ends of the auxiliary wiring film 17 are connected to the wiring films via through holes formed in an insulating film at a region of the three-dimensional intersection (three-dimensional intersection area). The central portion of the auxiliary wiring film is separated from other wiring films by the insulating film. In order for the wirings to be easily seen, the insulating film is omitted in the drawing.

In the magneto resistive sensor shown in FIG. 7, the magnetic laminated films and wiring films constitute a bridge circuit. The terminals 20a and 20e are power supply terminals, a power supply voltage Vcc was applied to the terminal 20a, and the terminal 20e was connected to the ground (GND) potential. In addition, the terminals 20b and 20c were interconnected by a lead, and the lead and terminal 20d were defined as output terminals. Then, the resistances of the magnetic laminated films were varied because of the variation of the magnetic field acting on the magnetic laminated films, and the output voltage responsive to the resistance variation was obtained between the terminal 20d serving as an output terminal and lead.

Figure 8:
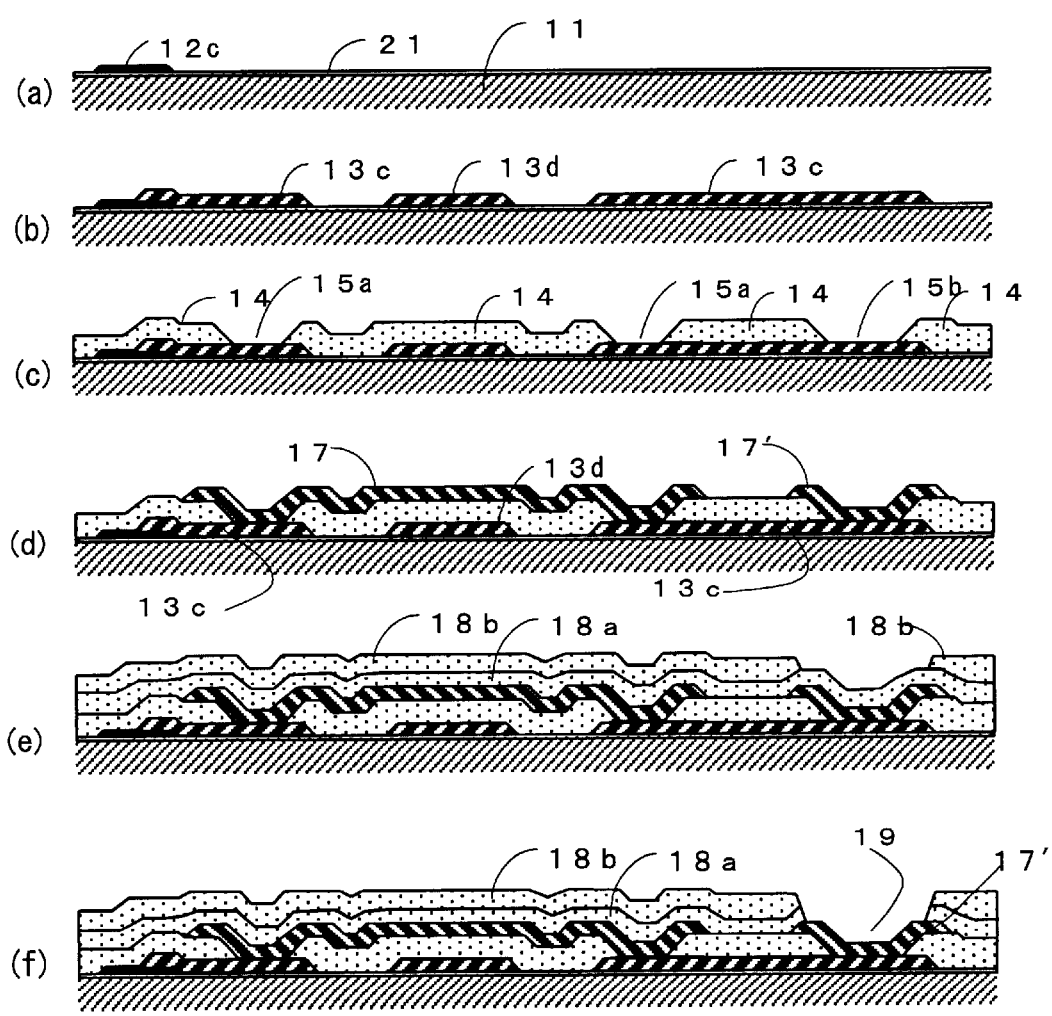
FIG. 8 is cross-sectional views explaining manufacturing processes of the magneto resistive sensor taken along the 8—8 line of FIG. 7.

FIG. 8 shows cross-sectional views of the magneto resistive sensor of FIG. 7 taken along the line 8—8, and a process (a) to (f) of this EXAMPLE of the invention will be described with reference to the drawing. A process for manufacturing the magneto resistive sensor according to the invention will be described below. (a) First, the alumina underlayer 21 was deposited to a thickness of 0.08 micrometer on the nonmagnetic substrate 11 by sputtering, and then the Ta underlayer (not shown) of 30 angstrom thickness and the magnetic laminated film 12c represented by [Ni—Fe—Co(16)/Cu(23)]14 were deposited. In the past, the Ta underlayer and magnetic laminated film were directly deposited on the nonmagnetic substrate, and therefore, if there was a minute scratch or the surface was coarse, a phenomenon in which the magnetic characteristics of the magnetic laminated film was varied occurred. However, providing the alumina underlayer 21 allows such a minute scratch to be filled, so that it becomes possible to neglect the surface condition of the substrate. Next, a resist pattern acting as a mask was deposited on the magnetic laminated film uniformly deposited on the substrate, and part that was not masked was removed by ion-milling. Thus, the magneto sensitive section made of the magnetic laminated film (GMR element) was patterned (equivalent to the magnetic laminated films 12a to 12d).

(b) Then, the wiring films 13d and 13c to be connected to the ends of the magneto sensitive section were formed in the lift-off method. Here, a resist pattern was previously provided on the portion where any wiring film was not to be formed. The wiring film was deposited thereon by sputtering, and then the resist and the wiring film deposited on the resist were removed through a resist stripping process, thereby forming the wiring films 13d and 13c eventually. The wiring films had a two-layered structure having a Cr underlayer of 0.02 micrometer thickness and a Cu film of 0.4 micrometer thickness thereon. The resist used in the lift-off method was the Stencil resist. This was because if a typical resist of a rectangular cross section was used, the film deposited by sputtering would cover the whole side of the resist, so that the resist stripper could not be introduced. The Stencil resist was formed in the following manner. First, a resist having a high developing rate was applied as a lower layer, and a resist having a low developing rate was applied as an upper layer. The resultant two-layered resist was simultaneously exposed for development, then the side of the lower resist was developed deeper than that of the upper resist, and accordingly, the pattern width of the lower resist was narrower than that of the upper resist. In this way, the Stencil resist was provided.

(c) Next, the insulating film 14 was deposited. This was intended to keep the wiring film 13d and auxiliary wiring film 17 insulated from each other at the three-dimensional intersection area of these wiring films. The through holes 15a were previously formed at the points where the wiring film 13c and auxiliary wiring film 17 were to be interconnected. In addition, since the auxiliary wiring film 17' was to be deposited on the wiring film 13c at the terminal, the through hole 15b was also formed at the terminal. The through holes 15a and 15b were formed in the lift-off method as in the case of the above-described wiring films. In the lift-off method at this time, a Stencil resist was provided at the portion where the through hole was to be formed, the insulating film was deposited, and then the insulating film on the portion where the through hole was to be formed was removed through the resist stripping process. In this EXAMPLE, the insulating film 14 was an alumina film of 0.6 micrometer thickness.

(d) Next, the auxiliary wiring film 17 was crossed with the wiring film 13d at the three-dimensional intersection area and connected to the wiring film 13c at the through hole 15a. Furthermore, for the terminal, the auxiliary wiring film 17' was deposited on the wiring film 13c. In this step also, as in the case of the wiring film 13c and the wiring film 13d it was formed in the lift-off method. The auxiliary wiring films 17 and 17' had a structure having a Cr underlayer of 0.02 micrometer thickness, a Cu film of 0.4 micrometer thickness deposited thereon, and a NiFe film of 0.1 micrometer thickness deposited thereon.

(e) Next, an alumina film of 2.0 micrometers thickness was deposited over the whole surface by sputtering to form a lower protective layer 18a. In addition, a thermosetting resist was applied on the lower protective layer 18a to a thickness of 2.0 micrometers, the resist on the area where an electrode drawing hole was to be formed was removed using photolithography, and the remaining resist was set by heating at 250 degrees centigrade to form an upper protective layer 18b. (f) The lower protective layer 18a exposed at the area where the upper protective layer 18b was removed was dry-etched to form an electrode drawing hole 19, so that the auxiliary wiring film 17' was exposed therethrough. In the dry etching, a mixed gas of boron trichloride ($BCl_3$) and chlorine ($Cl_2$) was used as an etchant. In the formation of the electrode drawing hole 19, wet etching using a liquid mixture of sodium hydrogencarbonate and sodium hydroxide may be used. In either etching, when the surface of the wiring film was made of Cu, the wiring film was corroded or etched. In this EXAMPLE, the surface of the auxiliary wiring film 17' was made of NiFe, and thus the wiring film was not corroded. After the etching, the mask resist was removed by a resist stripper. Lastly, solder was applied on the terminal section through the electrode drawing hole 19 to complete the magnetic sensor. In addition, the step of soldering a flexible wiring board to the terminal section of the magnetic sensor using lead-free solder (Sn—Ag eutectic solder) was carried out to provide the magneto resistive sensor of the magnetic encoder shown in FIG. 6. In this way, the magneto resistance ratio was not decreased owing to the thermal resistance of the magnetic laminated film, and the magnetic encoder with a high output could be provided.

Figure 6:
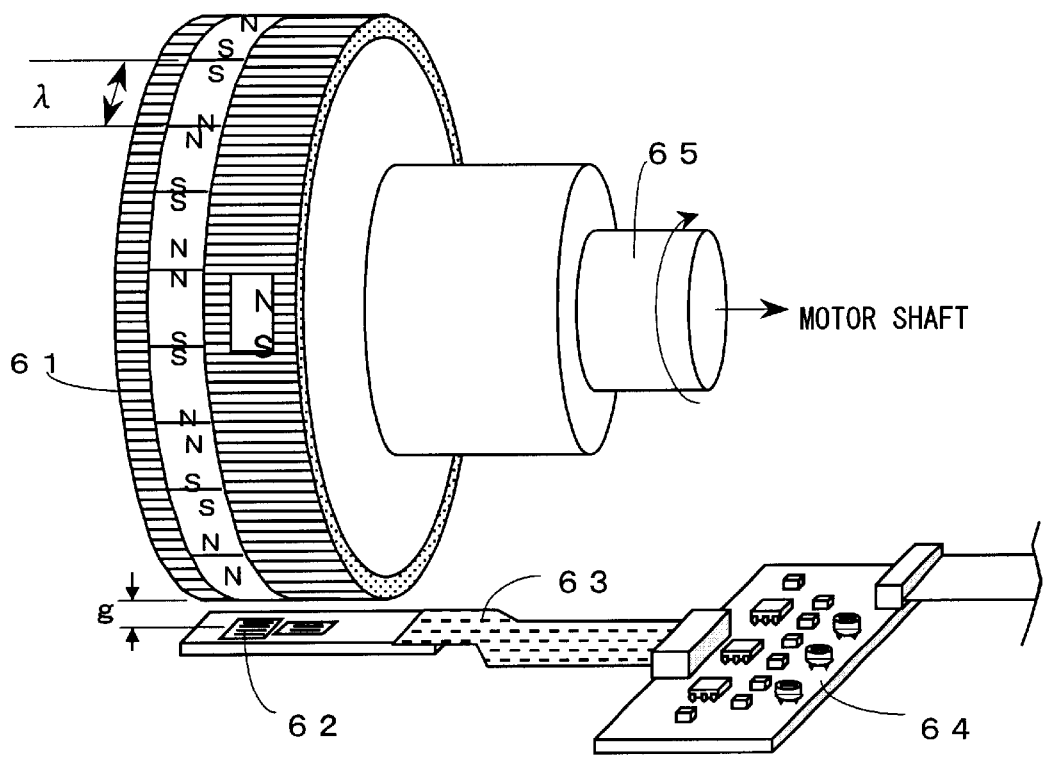
FIG. 6 is a perspective view for explanation of a magnetic rotary encoder using a magneto resistive sensor according to the invention.
Figure 9:
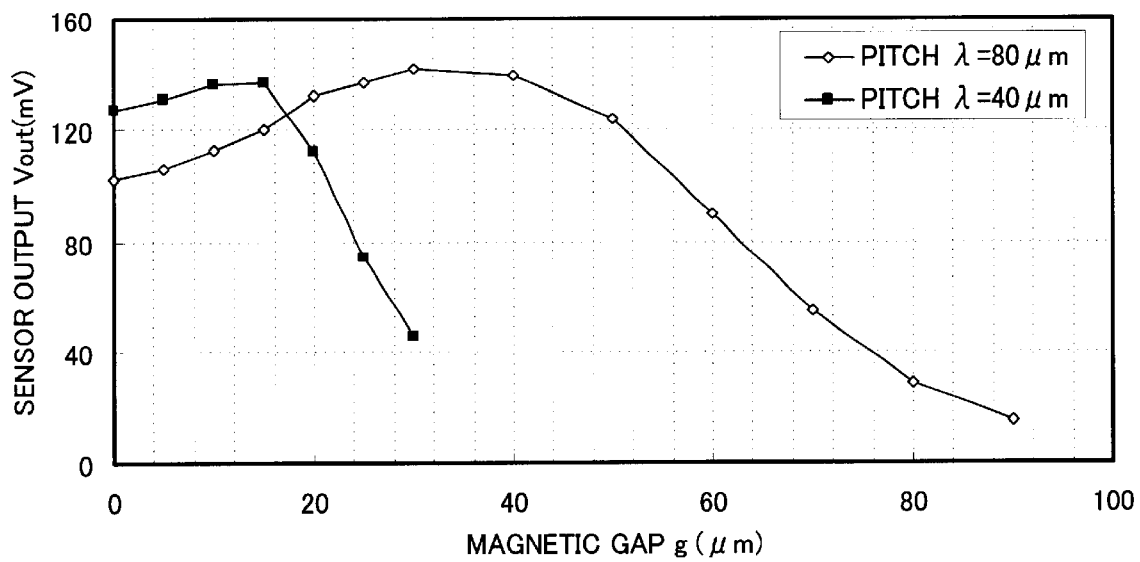
FIG. 9 is a graph with a parameter of magnetic pitch $\lambda$ showing the relationship between the sensor output voltages and the magnetic gaps g of the magnetic rotary encoder shown in FIG. 6.

Using two types of the magneto resistive sensor shown in FIG. 6 with magnetization pitches λ of 80 and 40 micrometers, two magnetic rotary encoders were prepared. FIG. 9 shows the output voltages thereof measured for the cases where the magnetic gap g between the magnetic medium 61 and magneto resistive sensor 62 was varied from 0 to 90 micrometers and where the magnetic gap g was varied from 0 to 30 micrometers, respectively.

In the case of the magnetization pitch λ of 80 micrometers, when the magnetic gap g was less than 75 micrometers, the output equal to or higher than 40 mV, that is the output of the conventional magneto resistive sensor, was obtained. In particular, within the range of the magnetic gap from 0 to 65 micrometers, the output was more than twice as high as that of the conventional magneto resistive sensor, and when the magnetic gap g was 30 micrometers, the maximum sensor output of 142 mV was obtained. In the case of the magnetization pitch λ of 40 micrometers, when the magnetic gap g was less than 30 micrometers, the output equal to or higher than that of the conventional magneto resistive sensor was obtained. Within the range of the magnetic gap from 0 to 25 micrometers, the output was more than twice as high as that of the conventional magneto resistive sensor, and when the magnetic gap g was 15 micrometers, the maximum sensor output of 137 mV was obtained.

The range of the magnetic gap within which a high sensor output can be obtained varies according to the magnetization pitch, and as the magnetization pitch becomes smaller, the gap becomes narrower. The usable magnetic gap g and magnetization pitch λ are in a proportional relationship, that is, g=Aλ, and the constant of proportionality A varies according to the material of the medium, magnetic field strength, sensor pattern and the like. In practical, the magnetic gap of a minimum of 2 micrometers can be used. In the case of a magnetic medium having a relatively large magnetization pitch and strong magnetic force, such as a permanent magnet, the magnetic gap up to 2 mm is permitted.

As described above, by using a magnetic sensor having a magnetic laminated film constituted by magnetic thin layers of a composition of NiCoFeB or NiFeB and nonmagnetic thin layers alternately laminated on a substrate, and a magnetic encoder having a magnetic medium facing the magnetic sensor via a gap 2 micrometers to 2 mm inclusive according to the invention, the magnetic encoder with a good thermal resistance and high magneto resistance ratio (output) of the magnetic laminated film can be provided can be provided. Furthermore, by providing an underlayer having a composition of NiFeCr or NiCr between the substrate and magnetic laminated film, the magnetic encoder with further improved thermal resistance and magneto resistance ratio (output) of the magnetic laminated film can be provided.

What is claimed is:
1. A magneto resistive sensor comprising:

a nonmagnetic substrate, an underlayer deposited on the substrate, and a magnetic laminated film formed on the underlayer, the magnetic laminated film having a plurality of magnetic thin layers of 5 to 30 angstroms in thickness alternately laminated with a nonmagnetic thin layer of 5 to 30 angstroms in thickness, the magnetic thin layer having a composition represented by the formula

[$(Ni_xCo_{1-x})_yFe_{1-y}]_zB_{1-z}$,
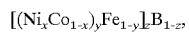

where $0.50<x\leq1.00$, $0.70\leq y<1.00$, $0.90\leq z<1.00$.

2. A magneto resistive sensor as set forth in claim 1, wherein the atomic ratio of nickel content to the sum of nickel and cobalt contents, or x, follows the inequality:

$0.60<x<1.00$.

3. A magneto resistive sensor as set forth in claim 2, wherein the number of said magnetic thin layers which are alternately laminated with a nonmagnetic thin layer is from 5 to 25.

4. A magneto resistive sensor as set forth in claim 3, wherein each of said magnetic thin layers is 10 to 22 angstroms thick.

5. A magneto resistive sensor as set forth in claim 4, wherein each of said nonmagnetic thin layers is 20 to 25 angstroms thick.

6. A magneto resistive sensor as set forth in claim 1, wherein said underlayer has a composition represented by the formula:

$(Ni_aFe_{1-a})_bCr_{1-b}$,
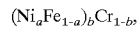

where $0.4\leq a\leq1.0$, $0.4\leq b\leq0.8$, and
the underlayer is 10 to 100 angstroms thick.

7. A magneto resistive sensor as set forth in claim 2, wherein said underlayer has a composition represented by the formula:

$$(Ni_aFe_{1-a})_bCr_{1-b},$$

where $0.4 \leq a \leq 1.0$, $0.4 \leq b \leq 0.8$, and the underlayer is 10 to 100 angstroms thick.

8. A magneto resistive sensor as set forth in claim 3, wherein said underlayer has a composition represented by the formula:

$$(Ni_aFe_{1-a})_bCr_{1-b},$$

where $0.4 \leq a \leq 1.0$, $0.4 \leq b \leq 0.8$, and the underlayer is 10 to 100 angstroms thick.

9. A magneto resistive sensor as set forth in claim 4, wherein said underlayer has a composition represented by the formula:

$$(Ni_aFe_{1-a})_bCr_{1-b},$$

where $0.4 \leq a \leq 1.0$, $0.4 \leq b \leq 0.8$, and the underlayer is 10 to 100 angstroms thick.

10. A magneto resistive sensor as set forth in claim 5, wherein said underlayer has a composition represented by the formula:

$$(Ni_aFe_{1-a})_bCr_{1-b},$$

where $0.4 \leq a \leq 1.0$, $0.4 \leq b \leq 0.8$, and the underlayer is 10 to 100 angstroms thick.

11. A magnetic encoder that detects a transposition of a magnetic medium, comprising:
   a magnetic medium having magnetic patterns recorded thereon and
   a magneto resistive sensor facing the medium via a magnetic gap and being relatively movable to the medium,
   the magneto resistive sensor comprising
      a nonmagnetic substrate,
      an underlayer deposited on the substrate, and
      a magnetic laminated film formed on the underlayer,
      the magnetic laminated film having a plurality of magnetic thin layers of 5 to 30 angstroms thickness alternately laminated with a nonmagnetic thin layer of 5 to 30 angstroms in thickness,
      the magnetic thin layer having a composition represented by the formula $$[(Ni_xCo_{1-x})_yFe_{1-y}]_zB_{1-z},$$

where $0.50 < x \leq 1.00$, $0.70 \leq y < 1.00$, $0.90 \leq z < 1.00$.

12. A magnetic encoder as set forth in claim 11, wherein the magnetic gap between the magnetic medium and the magneto resistive sensor is 2 micrometers to 2 mm.

13. A magnetic encoder as set forth in claim 11, wherein the atomic ratio of nickel content to the sum of nickel and cobalt contents, or x, follows the inequality:

$$0.60 < x < 1.00.$$

14. A magnetic encoder as set forth in claim 11, wherein the number of said magnetic thin layers which are alternately laminated with a nonmagnetic thin layer is from 5 to 25.

15. A magnetic encoder as set forth in claim 11, wherein each of said magnetic thin layers is 10 to 22 angstroms thick.

16. A magnetic encoder as set forth in claim 11, wherein each of said nonmagnetic thin layers is 20 to 25 angstroms thick.

17. A magnetic encoder as set forth in claim 11, wherein said underlayer has a composition represented by the formula:

$$(Ni_aFe_{1-a})_bCr_{1-b},$$

where $0.4 \leq a \leq 1.0$, $0.4 \leq b \leq 0.8$, and the underlayer is 10 to 100 angstroms thick.

18. A magnetic encoder as set forth in claim 12, wherein said underlayer has a composition represented by the formula:

$$(Ni_aFe_{1-a})_bCr_{1-b},$$

where $0.4 \leq a \leq 1.0$, $0.4 \leq b \leq 0.8$, and the underlayer is 10 to 100 angstroms thick.

19. A magnetic encoder as set forth in claim 13, wherein said underlayer has a composition represented by the formula:

$$(Ni_aFe_{1-a})_bCr_{1-b},$$

where $0.4 \leq a \leq 1.0$, $0.4 \leq b \leq 0.8$, and the underlayer is 10 to 100 angstroms thick.

20. A magnetic encoder as set forth in claim 14, wherein said underlayer has a composition represented by the formula:

$$(Ni_aFe_{1-a})_bCr_{1-b},$$

where $0.4 \leq a \leq 1.0$, $0.4 \leq b \leq 0.8$, and the underlayer is 10 to 100 angstroms thick.

21. A magnetic encoder as set forth in claim 15, wherein said underlayer has a composition represented by the formula:

$$(Ni_aFe_{1-a})_bCr_{1-b},$$

where $0.4 \leq a \leq 1.0$, $0.4 \leq b \leq 0.8$, and the underlayer is 10 to 100 angstroms thick.

22. A magnetic encoder as set forth in claim 16, wherein said underlayer has a composition represented by the formula:

$$(Ni_aFe_{1-a})_bCr_{1-b},$$

where $0.4 \leq a \leq 1.0$, $0.4 \leq b \leq 0.8$, and the underlayer is 10 to 100 angstroms thick.

* * * * *

UNITED STATES PATENT AND TRADEMARK OFFICE
CERTIFICATE OF CORRECTION

PATENT NO. : 6,692,847 B2
DATED : February 17, 2004
INVENTOR(S) : Fumio Shirasaki et al.

It is certified that error appears in the above-identified patent and that said Letters Patent is hereby corrected as shown below:

Title page,
Item [56], References Cited, FOREIGN PATENT DOCUMENTS, change
"JP     09-12051     5/1997" to -- JP     09-120521     5/1997 --.

Signed and Sealed this

Fifth Day of October, 2004

JON W. DUDAS
*Director of the United States Patent and Trademark Office*